(12) United States Patent
Endoh

(10) Patent No.: US 6,730,586 B2
(45) Date of Patent: May 4, 2004

(54) SEMICONDUCTOR DEVICE HAVING AN OVERHANGING STRUCTURE AND METHOD FOR FABRICATING THE SAME

(75) Inventor: Hiroshi Endoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/092,308

(22) Filed: Mar. 7, 2002

(65) Prior Publication Data

US 2002/0140041 A1 Oct. 3, 2002

(30) Foreign Application Priority Data

Mar. 30, 2001 (JP) .......................................... 2001-101443

(51) Int. Cl.[7] .............................................. H01L 21/28
(52) U.S. Cl. ........................ 438/574; 438/571; 438/579; 438/182
(58) Field of Search ................................. 438/170, 167, 438/182, 570–574, 578–579; 257/280, 431

(56) References Cited

U.S. PATENT DOCUMENTS

| | | | | |
|---|---|---|---|---|
| 5,334,542 A | * | 8/1994 | Saito et al. .................. | 438/579 |
| 5,550,065 A | * | 8/1996 | Hashemi et al. ............. | 438/182 |
| 5,557,141 A | * | 9/1996 | Harada et al. ................ | 257/14 |
| 5,621,233 A | * | 4/1997 | Sharma et al. ............... | 257/316 |
| 5,693,544 A | * | 12/1997 | Abrokwah et al. .......... | 438/285 |
| 6,037,245 A | * | 3/2000 | Matsuda ....................... | 438/586 |
| 6,204,102 B1 | * | 3/2001 | Yoon et al. ................... | 438/182 |
| 6,204,133 B1 | * | 3/2001 | Yu et al. ....................... | 438/299 |
| 6,239,007 B1 | * | 5/2001 | Wu ............................... | 438/585 |
| 6,309,933 B1 | * | 10/2001 | Li et al. ....................... | 438/181 |
| 6,392,278 B1 | * | 5/2002 | Kimura ........................ | 257/202 |
| 6,455,364 B1 | * | 9/2002 | Asai et al. ................... | 438/235 |
| 6,506,649 B2 | * | 1/2003 | Fung et al. .................. | 438/300 |

FOREIGN PATENT DOCUMENTS

| | | |
|---|---|---|
| JP | 60-111474 A | 6/1985 |
| JP | 63-023367 A | 1/1988 |
| JP | 02-194652 A | 8/1990 |
| JP | 09-045707 A | 2/1997 |
| JP | 10-303214 A | 11/1998 |

OTHER PUBLICATIONS

Silicon Processing for VLSI Era, vol. 1—Process Technology by S. Wolf and R.N. Tauber, pp. 407–409.*
Office Action dated May 23, 2003 in co–pending Japanese Application No. 2001–101443 and translation.

* cited by examiner

Primary Examiner—Long Pham
Assistant Examiner—Thao X. Le
(74) Attorney, Agent, or Firm—Westerman, Hattori, Daniels & Adrian, LLP

(57) ABSTRACT

An edge of a passivation film is positioned inside an edge of an overhanging emitter structure by a distance L so that a base electrode layer is formed at an interval not to overlap the edge of the passivation film even when the base electrode layer is formed by etching with the emitter structure as a mask.

14 Claims, 9 Drawing Sheets

SEMICONDUCTOR DEVICE HAVING AN OVERHANGING STRUCTURE AND METHOD FOR FABRICATING THE SAME

CROSS-REFERENCE TO RELATED APPLICATIONS

This application is based upon and claims priority of Japanese Patent Application No. 2001-101443, filed on Mar. 30, 2001, the contents being incorporated herein by reference.

BACKGROUND OF THE INVENTION

1. Field of the Invention

The present invention relates to a semiconductor device having an overhanging structure and an electrode near the structure and a method for fabricating the same and particularly, the present invention is preferable to be applied to a hetero-junction bipolar transistor (HBT) or the like made of a group III–V compound semiconductor.

2. Description of the Related Art

A III–V group compound semiconductor transistor such as an HBT is widely utilized as a high-frequency and high-speed switching element.

FIG. 12 is a schematic cross-sectional view showing an example of a conventional HBT.

In the HBT, an n-type GaAs collector layer 102, a p-type GaAs base layer 103, and an emitter layer 104 are laminated in sequence on a semi-insulating GaAs substrate 101 by a metal-organic chemical vapor deposition method (an MOCVD method), and an ohmic emitter electrode layer 105 is provided on the emitter layer 104.

In the emitter layer 104, an n-type InGaP layer 104a, an n-type GaAs layer 104b, an n-type InGaP layer 104c, an n-type GaAs layer 104d, and an n-type InGaAs layer 104e are laminated in sequence, in which the n-type InGaP layer 104c, the n-type GaAs layer 104d, the n-type InGaAs layer 104e, and the emitter electrode layer 105 are processed to be a structure in an overhanging shape. The structure is constituted of the n-type InGaP layer 104c, the n-type GaAs layer 104d, and the n-type InGaAs layer 104e composing a stem portion and the emitter electrode layer 105 composing an umbrella-shaped portion.

Then, a protective film 106 constituted in a manner in which an insulating film is deposited on the entire surface to cover the overhanging structure and the insulating film is removed by etching with the umbrella-shaped portion as a mask, a base electrode layer 107 constituted on the n-type GaAs layer 104b by etching with the umbrella-shaped portion as a mask, in the same way as the protective film 106, and a collector electrode layer 108 formed on the n-type GaAs collector layer 102 at a bottom of an opening which is formed in the n-type GaAs layer 104b, the n-type InGaP layer 104a, the p-type GaAs base layer 103, and the n-type GaAs collector layer 102 are provided, and an interlayer insulating film 109 is formed on the entire surface so as to constitute the HBT.

In the HBT constituted as above, however, a trouble easily occurs in its base electrode layer, which mainly causes deterioration of reliability of a device in a high-temperature operation. This problem is caused not only on the HBT but also on a semiconductor device having an overhanging structure, in which an electrode is formed on a semiconductor layer with using the structure as a mask, for example, a self-aligned field effect transistor (FET) or the like, and early solution is presently awaited.

SUMMARY OF THE INVENTION

It is an object of the present invention to provide, among semiconductor devices having an overhanging structure on a semiconductor layer, in which an electrode is formed on the semiconductor layer with the structure as a mask, represented by an HBT and an MESFET, a semiconductor device suppressing a trouble which tends to occur on the electrode (a base electrode layer in a case of HBT and a gate electrode in a case of MESFET) and realizing high reliability of the device especially in a high-temperature operation, and a method for fabricating the same.

As a result of intensive studies, the inventor has thought of forms of the invention explained below.

The present invention is applied to a semiconductor device having an overhanging structure on a semiconductor layer, in which an electrode is formed on the semiconductor layer with the structure as a mask, such as an HBT and a self-aligned FET, and a method for fabricating the same.

In a case of HBT, the structure is an emitter structure and the electrode is a base electrode, while in a case of self-aligned FET, the structure is a gate electrode and the electrode is a source and drain.

The semiconductor device of the present invention is characterized in that it comprises: a semiconductor layer; an overhanging structure formed on the semiconductor layer and having an umbrella-shaped portion; a protective film covering at least a part of a surface of the structure with an edge thereof on the semiconductor layer being positioned inside an edge of the umbrella-shaped portion; and an electrode formed at a position outside the umbrella-shaped portion at an interval from the edge of the protective film on the semiconductor layer.

The method for fabricating the semiconductor device of the present invention is characterized in that it comprises the steps of: forming an overhanging structure having an umbrella-shaped portion on a semiconductor layer; forming a protective film to cover a surface of the structure; processing the protective film by removal so that an edge thereof on the semiconductor layer is positioned inside an edge of the umbrella-shaped portion; depositing an electrode material on the semiconductor layer with the umbrella-shaped portion as a mask; and processing the electrode material to form an electrode at an interval from the edge of the protective film.

Specifically, here, the protective film is formed into a state of existing inside the edge of the umbrella-shaped portion on the semiconductor layer.

Such a shape of the protective film can be realized by forming a mask in a shape covering an area under the umbrella-shaped portion with an edge thereof being positioned inside the edge of the umbrella-shaped portion, and selectively removing the protective film using the mask.

The mask can be realized by executing the steps of: applying a resist onto the entire surface including the area under the umbrella-shaped portion; exposing the entire surface of the resist to light; and developing the resist so that an unexposed part thereof selectively remains in the area under the umbrella-shaped portion.

On the other hand, it is also preferable that the protective film is etched by an etching method having a directivity with respect to the surface, instead of using the aforesaid mask, and that the edge of the protective film is made to be positioned inside the edge of the umbrella-shaped portion by controlling the amount of etching.

Further, it is also preferable to form the protective film so that its edge is positioned at a contact point of a root of the structure and the semiconductor layer by leaving the protective film in a state of being substantially removed from the surface of the semiconductor layer.

Such a shape of the protective film can be realized by executing the steps of: forming a resist covering the entire surface including the area under the umbrella-shaped portion, constituted in a manner in which a first layer having high optical sensitivity and a film thickness covering a part of the area under the umbrella-shaped portion and a second layer having low optical sensitivity are laminated; exposing the entire surface of the resist to light; and forming a mask for processing the protective film by, in the area under the umbrella-shaped portion, developing the resist according to the respective optical sensitivity of the first layer and the second layer so as to be left in a shape covering only a surface of the structure in the area under the umbrella-shaped portion.

DETAILED DESCRIPTION OF THE PREFERRED EMBODIMENTS (Basic Explanation of the Present Invention)

Figure 12:
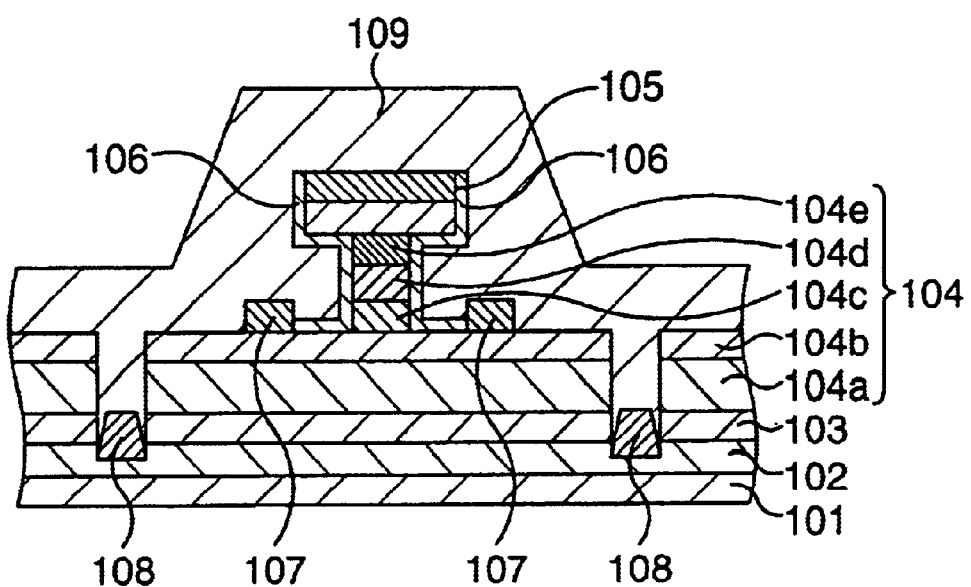
FIG. 12 is a schematic cross-sectional view showing an example of conventional HBT.

When a high-temperature conduction test was conducted on a conventional HBT constituted as shown in FIG. 12, it was revealed that elements deteriorated in a short time.

Figure 1A:
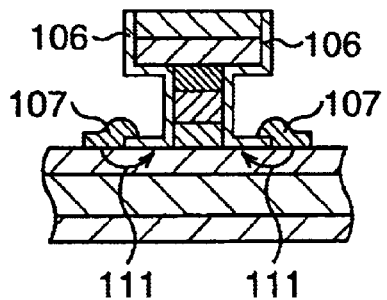
FIG. 1A and FIG. 1B are schematic cross-sectional views showing a result obtained by a high-temperature conduction test conducted on a conventional HBT.

This sample deteriorated by the conduction was observed by cross-sectional TEM observation and it was found that, as shown in FIG. 1A, a metallic material of a base electrode layer 107 is abnormally diffused toward an n-type GaAs emitter layer 104b side (shown by an arrow 111).

Figure 1B:
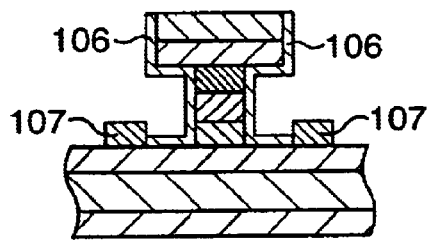

Further, the comparison of the sample in which the metallic material is abnormally diffused (FIG. 1A) with a normal sample in which the abnormal diffusion does not occur (FIG. 1B) by cross-sectional TEM observation proved that the metallic material of the base electrode 107 is riding on (hereinafter, this state is referred to as overlap) a protective film (a passivation film) 106 in the sample with the abnormal diffusion.

Figure 2:
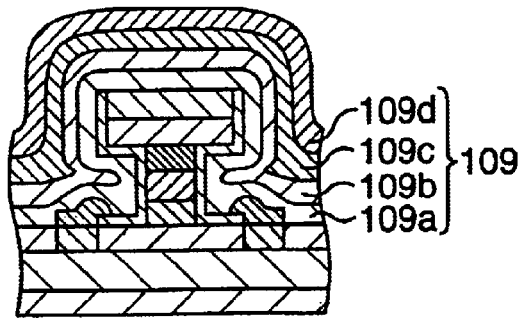
FIG. 2 is a schematic cross-sectional view showing a state in which an interlayer insulating film of the HBT is multi-layered.

On the overlapped area, an interlayer insulating film 109 is formed to cover the entire surface, and as shown in FIG. 2, the interlayer insulating film 109 is formed as a film composed of multiple layers of different thermal expansion ratios (in this case, a multi-layered film in which a SiN film 109a(BD) by optical CVD, a SiN film 109b(RL) by plasma CVD, a SiN film 109c(RL) by optical CVD, and a SiN film 109d(CA) by plasma CVD are sequentially laminated), which causes an area near the base electrode layer 107 to be in an extremely complicated state and an excessive stress to be given to the area.

Figure 3:
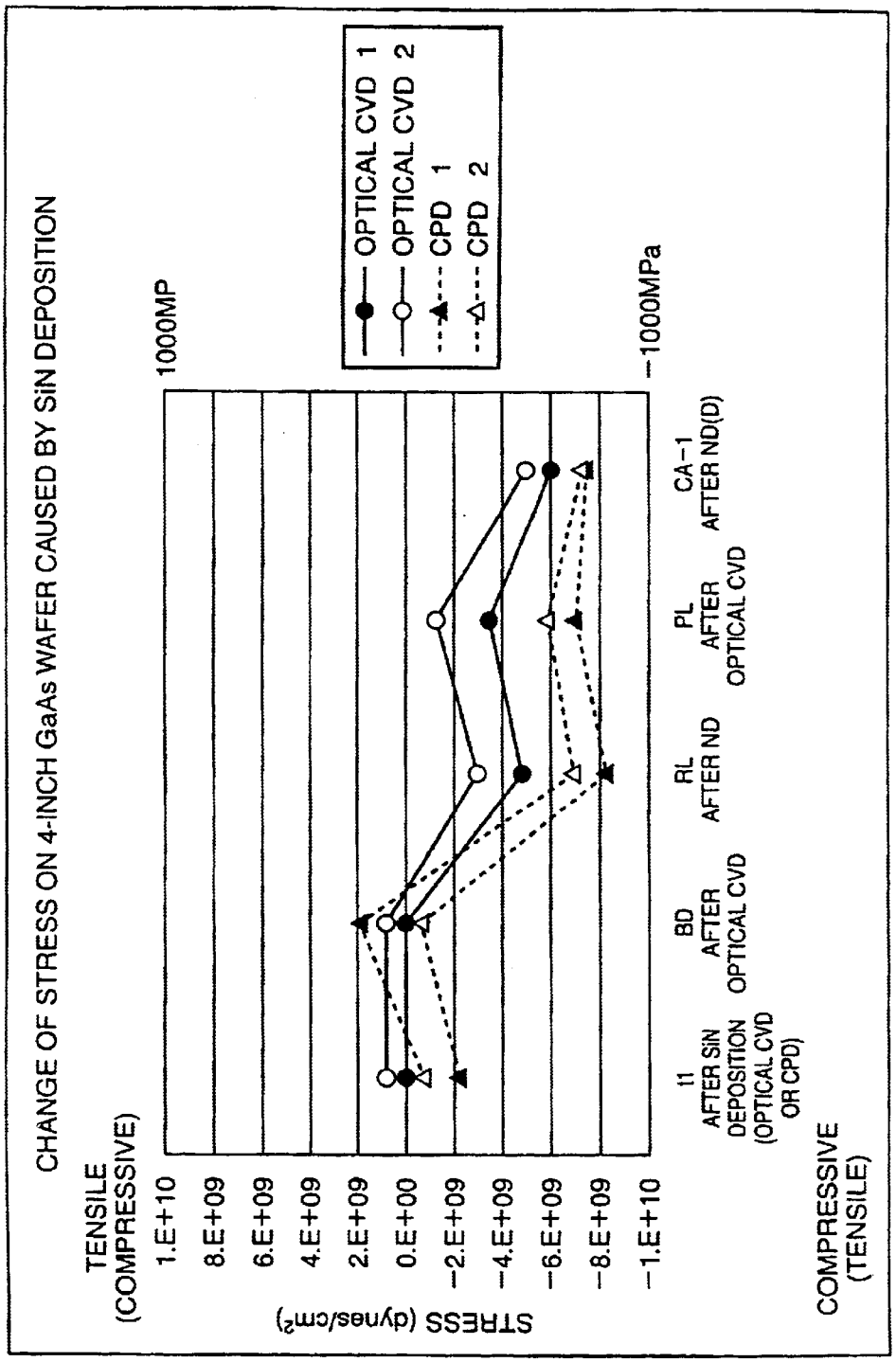
FIG. 3 is a chart showing characteristics as a result of studying the change of a stress given to the interlayer insulating film of the HBT for each film composing the interlayer insulting film.

The change of stress values in a case in which the interlayer insulating film 109 is laminated on a GaAs substrate through the steps of fabricating the HBT is shown in FIG. 3.

Here, a compressive direction is defined as a direction in which a surface protrudes. Since a surface of the substrate is tensed, a lattice constant becomes larger than that in a normal state, and a compressive stress is given (by the restoring force of the whole substrate) in this state.

As clearly understood from FIG. 3, a stress greatly changes at every time each of the laminated films composing the interlayer insulating film 109 is formed. The abnormal diffusion easily progresses in an area where the stress is given because an arrangement of atoms in a semiconductor crystal, which are originally arranged in a systematic way, is disturbed by a strong stress, causing the abnormal diffusion.

Figure 4:
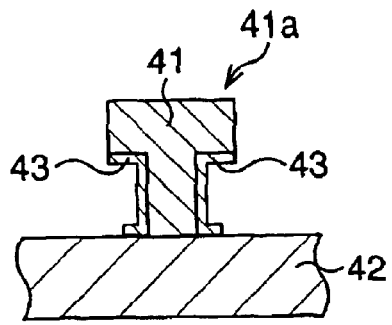
FIG. 4 is a schematic cross-sectional view showing a form of a passivation film according to the present invention.
Figure 5:
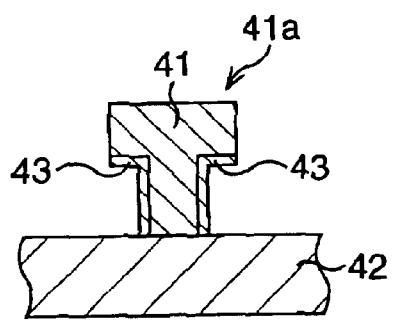
FIG. 5 is a schematic cross-sectional view showing another form of the passivation film according to the present invention.

As a retracting state of a passivation film 43 on a semiconductor layer, there can be considered a form in which the passivation film 43 is left to exist on a part of a surface of a semiconductor layer 42 facing an umbrella-shaped portion 41a of an overhanging structure 41 and inside an edge of the umbrella-shaped portion 41a as shown in FIG. 4, and a form in which the whole passivation film 43 is removed from an area on the surface of the semiconductor layer 42 facing the umbrella-shaped portion 41a as shown in FIG. 5.

Figure 6:
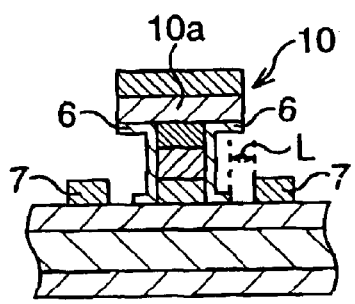
FIG. 6 is a schematic cross-sectional view showing an outline of an area near an overhanging structure of an HBT constituted corresponding to FIG. 4.

The former form is applied to an HBT of the present invention, as shown in FIG. 6, in which an edge of a passivation film 6 is positioned inside an edge of an overhanging emitter structure 10 by a distance L, and a base electrode layer 7 is formed at an interval so as not to overlap the edge of the passivation film 6 even when the base electrode layer 7 is etched with the emitter structure 10 as a mask. Accordingly, abnormal diffusion of a metallic material (a base metal) of the base electrode layer 7 due to a stress caused by an interlayer insulating film 9 which is formed by multiple layers can be prevented.

The constitution shown in FIG. 6 particularly works on the HBT effectively. In the HBT, the passivation film 6 is needed on an area on the semiconductor layer facing an umbrella-shaped portion 10a of the overhanging emitter structure 10 in order to keep a surface of the semiconductor layer and the base electrode 7 from coming into contact with each other due to the spread of the metallic material of the base electrode layer 7 in vapor deposition. If a contact distance due to the spread of the base metal extends toward the emitter side, a diode characteristic between the emitter and the base becomes leaky, which causes deterioration of a transistor characteristic. In this case, a desirable retracting position of the passivation film 6 is an original normal diffusion amount of the base metal (approximately 0.1 μm) or less, which does not affect the diode characteristic.

Figure 7:
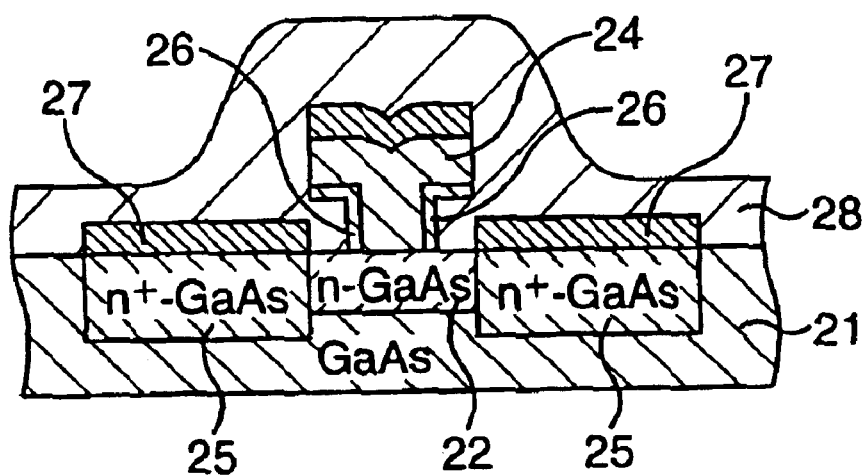
FIG. 7 is a schematic cross-sectional view showing an outline of an area near an overhanging structure of an MESFET constituted corresponding to FIG. 5.

The latter form is applied to an MESFET of the present invention, as shown in FIG. 7, in which a passivation film 26 is formed so that its edge is positioned at a contact point of a root of an overhanging gate electrode 24 and an n-GaAs region 22, and an ohmic electrode layer 27 is formed at an interval so as not to overlap the edge of the passivation film 26 even when the ohmic electrode layer 27 is formed by etching with the gate electrode 24 as a mask. Accordingly, abnormal diffusion of a metallic material of the ohmic electrode layer 27 due to a stress caused by an interlayer insulating film 28 which is formed by multiple layers can be prevented.

The constitution shown in FIG. 7 particularly works on a self-aligned FET (an MESFET having an overhanging gate electrode in this case) effectively. In the FET, since a stress on a surface between the gate and ohmic electrodes has a risk of causing a gate width dependence of a threshold voltage ($V_{th}$), it is desirable to remove a passivation film from an area facing an umbrella-shaped portion of the overhanging gate electrode so as to eliminate the stress. Incidentally, this constitution can also be applied to the HBT.

Based on the above basic explanation, preferred embodiments to which the present invention is applied will be explained below in detail with reference to the drawings.

First Embodiment

A hetero-junction bipolar transistor (HBT) is described as an example of a semiconductor device in this embodiment. Here, the constitution of the HBT will be explained together with a method for fabricating the same for convenience.

FIG. 8A to FIG. 8D and FIG. 9A to FIG. 9D are schematic cross-sectional views showing a method for fabricating the HBT according to the first embodiment in the order of steps.

Figure 8A:
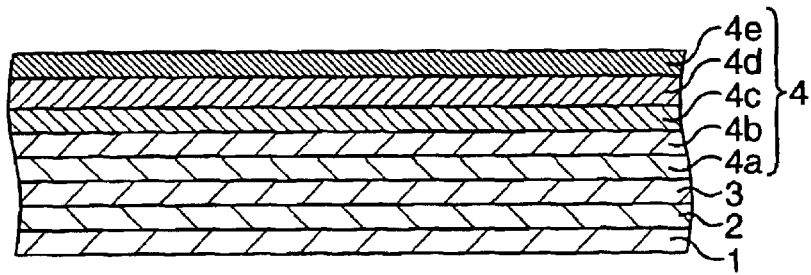
FIG. 8A to FIG. 8D are schematic cross-sectional views showing a method for fabricating an HBT according to the first embodiment in the order of steps.

In order to fabricate this HBT, as shown in FIG. 8A, an n-type GaAs collector layer 2, a p-type GaAs base layer 3, and an emitter layer 4 are first laminated in sequence on a semi-insulating GaAs substrate 1 by a metal-organic chemical vapor deposition method (an MOCVD method).

Here, the emitter layer 4 is formed by laminating an n-type InGaP layer 4a, an n-type GaAs layer 4b, an n-type InGaP layer 4c, an n-type GaAs layer 4d, and an n-type InGaAs layer 4e in sequence.

Figure 8B:
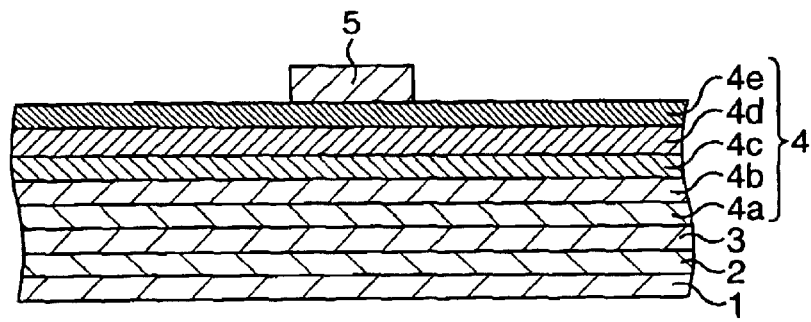

Next, as shown in FIG. 8B, an emitter electrode layer is laminated on the n-type InGaAs layer 4e and processed by photolithography and subsequent dry etching to pattern and form an emitter electrode layer 5.

Figure 8C:
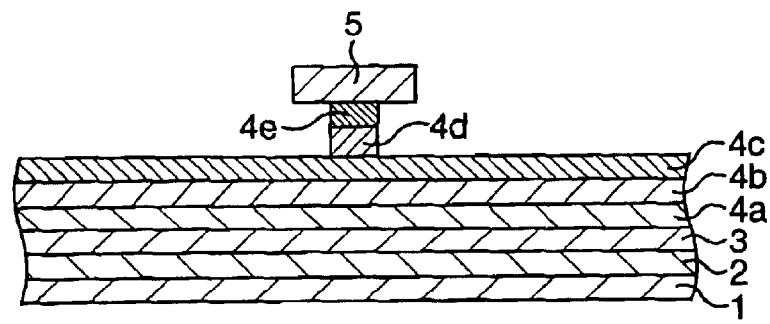

Then, as shown in FIG. 8C, the n-type InGaAs layer 4e and the n-type GaAs layer 4d are etched with the emitter electrode layer 5 as a mask to expose the n-type InGaP layer 4c. In the etching process, selective dry etching is performed up to a not-shown AlGaAs layer and then selective wet etching is performed up to the n-type InGaP layer 4c. By the selective wet etching, the n-type GaAs layer 4d is side etched.

Figure 8D:
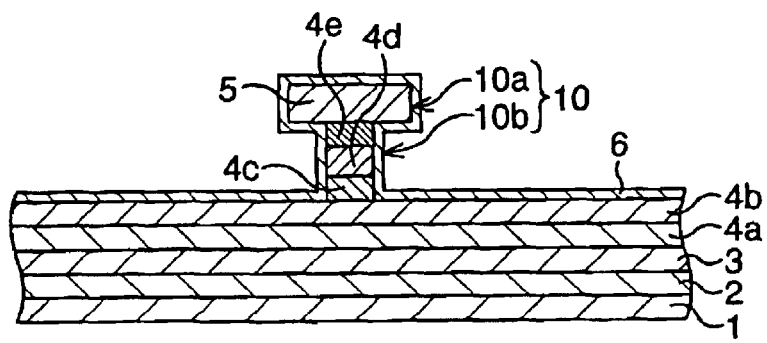

Subsequently, as shown in FIG. 8D, the n-type InGaP layer 4c is etched so that an overhanging emitter structure 10 is obtained. In the emitter structure 10, the n-type InGaP layer 4c, the n-type GaAs layer 4d, and the n-type InGaAs layer 4e compose a stem portion 10b and the emitter electrode layer 5 composes an umbrella-shaped portion 10a.

Next, a protective film (a passivation film) 6 made of SiN is formed on the entire surface to cover the emitter structure 10.

Figure 9A:
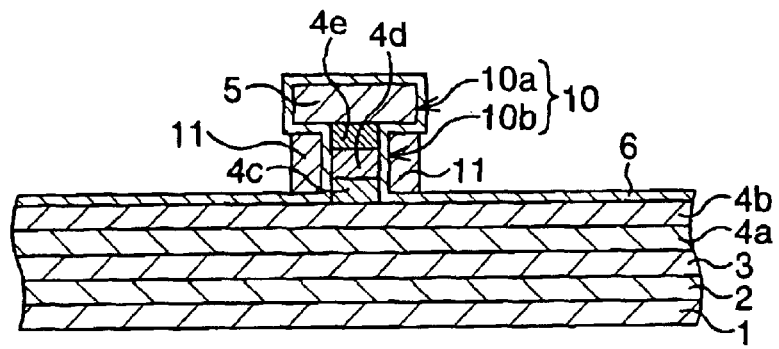
FIG. 9A to FIG. 9D are schematic cross-sectional views showing the method for fabricating the HBT according to the first embodiment in the order of steps, in succession to FIG. 8D.

Subsequently, as shown in FIG. 9A, a resist mask 11 having a shape covering an area under the umbrella-shaped portion 10a with its edge being positioned inside an edge of the umbrella-shaped portion 10a is formed by applying a resist to the entire surface, exposing the entire surface of the resist to light, and developing the resist so that an unexposed area thereof selectively remains in an area under the umbrella-shaped portion 10a.

Figure 9B:
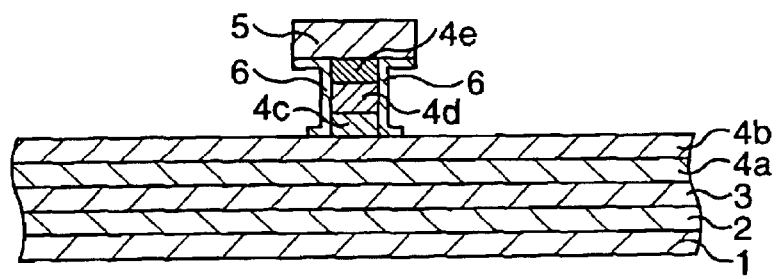

Then, as shown in FIG. 9B, the passivation film 6 is wet etched to remove a part of the passivation film 6 which is not covered by the resist mask 11. The resist mask 11 is then removed by ashing treatment or the like using $O_2$ plasma to process the passivation film 6 to be left in a state of existing inside an edge of the umbrella-shaped portion 10a on the n-type GaAs layer 4b.

Figure 9C:
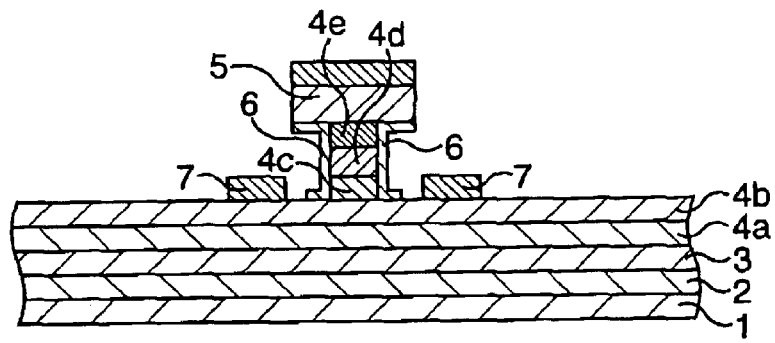

Next, as shown in FIG. 9C, a base electrode layer 7 is patterned and formed by evaporating a base electrode layer onto the entire surface and processing the base electrode layer with the resist as a mask by an ion milling method. At this time, the umbrella-shaped portion 10a serves as an etching mask and the base electrode layer 7 is formed at an interval so as not to overlap an edge of the passivation film 6.

Incidentally, it is also preferable that, in processing the passivation film 6 to be left in the state of existing inside the edge of the umbrella-shaped portion 10a on the n-type GaAs layer 4b, the passivation film 6 is etched by an etching method having a directivity with respect to the surface, instead of using a mask such as the resist mask 11, and that the edge of the passivation film 6 is made to be positioned inside the edge of the umbrella-shaped portion 10a by controlling the amount of etching.

Figure 9D:
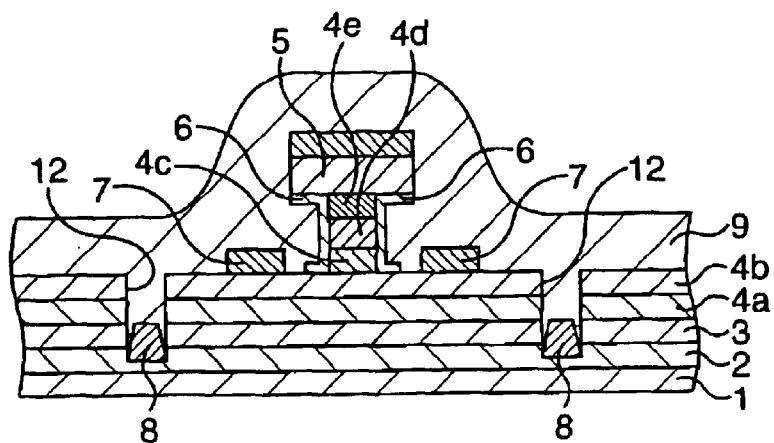

Subsequently, as shown in FIG. 9D, an opening 12 is formed in the n-type GaAs layer 4b, the n-type InGaP layer 4a, the p-type GaAs base layer 3, and the n-type GaAs collector layer 2, and a collector electrode layer 8 is formed by lift-off on the n-type GaAs collector layer 2 which exposes at a bottom of the opening 12.

Then, an interlayer insulating film 9 is deposited and formed to cover the entire surface so as to complete bulk steps. This interlayer insulating film 9 is, similar to the interlayer insulating film 109, a multi-layered film in which a SiN film by optical CVD, a SiN film by plasma CVD, a SiN film by optical CVD, and a SiN film by plasma CVD are sequentially laminated.

Thereafter, through various subsequent processes, the HBT is completed.

As explained above, in this embodiment, the passivation film 6 is processed to be left in the state of existing inside the edge of the umbrella-shaped portion 10a on the n-type GaAs layer 4b, and thereby the base electrode layer 7 is formed at an interval so as not to overlap the edge of the passivation film 6, which makes it possible to suppress a trouble which may occur on the base electrode layer 7 and to ensure high reliability of a device particularly in a high temperature operation.

Second Embodiment

In this embodiment, an MESFET, which is a compound semiconductor device, is described as an example. Here, the constitution of the MESFET will be explained together with a method for fabricating the same for convenience.

FIG. 10A to FIG. 10D and FIG. 11A to FIG. 11D are schematic cross-sectional views showing a method for fabricating the MESFET according to the second embodiment in the order of steps.

Figure 10A:
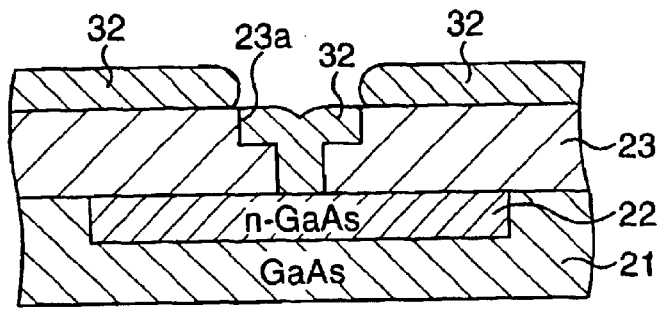
FIG. 10A to FIG. 10D are schematic cross-sectional views showing a method for fabricating an MESFET according to the second embodiment in the order of steps.
Figure 10B:
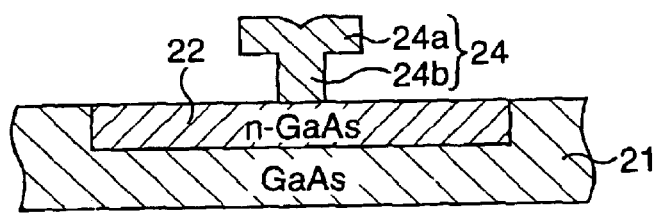

In order to fabricate this MESFET, as shown in FIG. 10A, a non-doped GaAs substrate 21 is first prepared and n-type impurities for forming a channel region are ion-implanted into a surface of the GaAs substrate 21 to form an n-type GaAs region 22.

Next, an overhanging gate electrode 24 is formed by lift-off. Specifically, a not-shown dummy gate made of silicon oxide or the like is formed on the n-GaAs region 22 and, using this, a resist pattern 23 having an opening 23a in a shape shown in FIG. 10A is formed.

A tungsten silicide (WSi) layer 32 is then deposited and formed on the resist pattern 23 by a sputtering method so as to fill in the opening 23a.

Subsequently, the resist pattern 23 and the unnecessary WSi layer 32 thereon are removed so that the overhanging gate electrode 24 following a shape of the opening 23a is formed. In the gate electrode 24, an umbrella-shaped portion 24a and a stem portion 24b compose the overhanging shape.

Figure 10C:
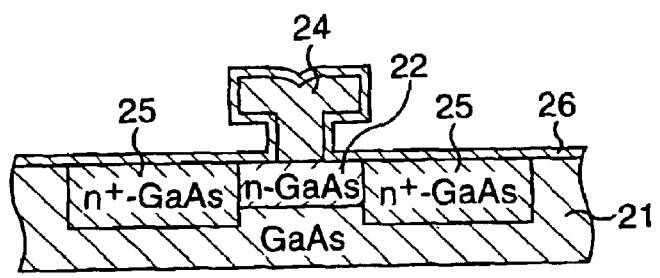

Next, a photo resist is applied to form a not-shown resist mask covering a predetermined region on the GaAs substrate 21 including the gate electrode 24 by photolithography. Using the resist mask, as shown in FIG. 10C, n-type impurities is ion-implanted into an surface of the exposed n-GaAs region 22 (a portion to be an ohmic region in this case) to form a pair of n$^+$-GaAs regions 25 which will be a source and a drain.

A protective film (a passivation film) 26 made of SiN is then formed on the entire surface to cover the gate electrode 24.

Figure 10D:
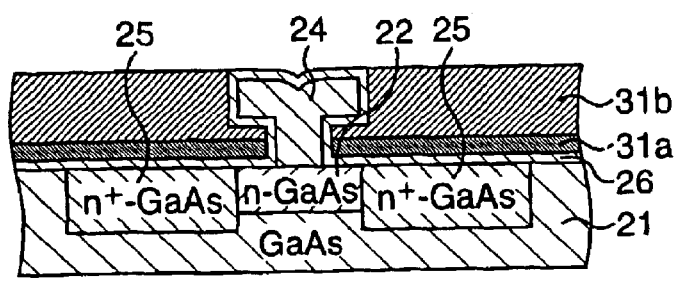

Subsequently, as shown in FIG. 10D, a resist covering the entire surface including an area under the umbrella-shaped portion 24a, in which a first resist 31a having high optical sensitivity and a film thickness covering a part of the area under the umbrella-shaped portion 24a and a second resist 31b having low optical sensitivity are laminated, is applied.

Figure 11A:
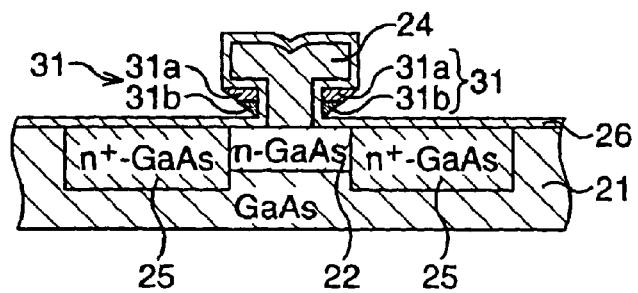
FIG. 11A to FIG. 11D are schematic cross-sectional views showing the method for fabricating the MESFET according to the second embodiment in the order of steps, in succession to FIG. 10D.

Then, as shown in FIG. 11A, a resist mask 31 is formed by exposing the entire surface of the resist to light and developing the resist according to the respective optical sensitivities of the first resist 31a and the second resist 31b in the area under the umbrella-shaped portion 24a so that the resist is left in a shape covering only a surface of the gate electrode 24 in the area under the umbrella-shaped portion 24a.

Figure 11B:
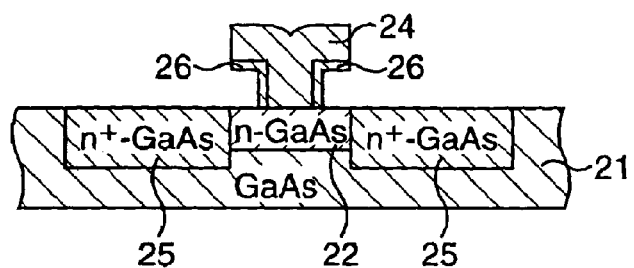
Figure 11C:
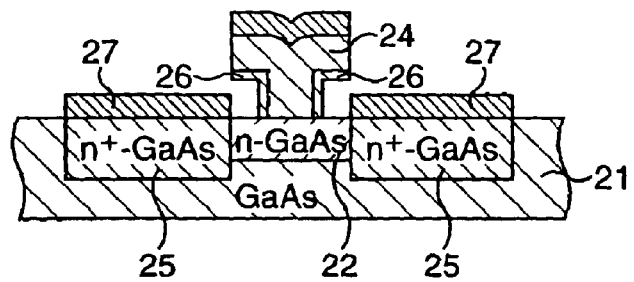
Figure 11D:
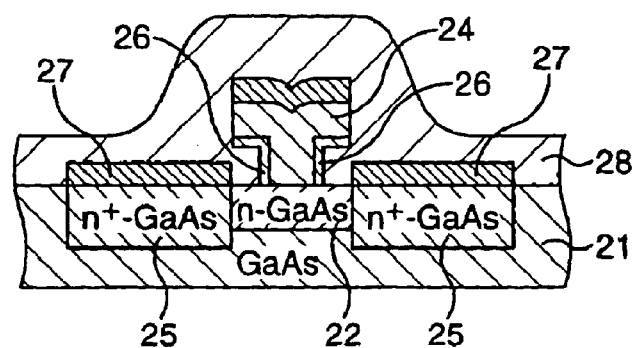

Next, as shown in FIG. 11B, the passivation film 26 is wet-etched to remove a part of the passivation film 26 which is not covered with the resist mask 31. The resist mask 31 is then removed by ashing treatment or the like using $O_2$ plasma to process the passivation film 26 into a state of being substantially removed from the surface of the GaAs substrate 21, that is, a state in which an edge of the passivation film 26 is positioned at a contact point of a root of the stem portion 24b and the n-GaAs region.

Subsequently, as shown in FIG. 1C, after a not-shown resist mask with a region of the gate electrode 24 and regions to be ohmic electrode layers 27 being open is formed, Au is evaporated on the entire surface, and the Au is processed by lift-off to remove the resist so as to pattern and form the ohmic electrode layers 27 connected with the n$^+$-GaAs regions 25. At this time, the umbrella-shaped portion 24a serves as an etching mask, and the ohmic electrode layers 27 are formed at intervals so as not to overlap the edge of the passivation film 26.

Then, as shown in FIG. 1D, an interlayer insulating film 28 is deposited and formed to cover the entire surface to complete bulk process.

Thereafter, through various subsequent processes, the MESFET is completed.

As explained above, in this embodiment, the passivation film 26 is processed into a state of being substantially removed from the surface of the GaAs substrate 21, and thereby the ohmic electrode layers 27 are formed at intervals so as not to overlap the edge of the passivation film 26, which makes it possible to suppress a trouble which may occur on the ohmic electrode layers 27 and to ensure high reliability of a device particularly in a high temperature operation.

Incidentally, although the HBT is explained in the first embodiment and the MESFET in the second embodiment as examples, the present invention is not limited to them and can be effectively applied to any semiconductor device having an overhanging structure on a semiconductor layer, in which an electrode is formed on the semiconductor layer with the structure as a mask.

According to the present invention, in semiconductor devices having an overhanging structure on a semiconductor layer thereof, in which an electrode is formed on the semiconductor layer with the structure as a mask, as represented by an HBT and an MESFET, a trouble which may occur on the electrode (a base electrode layer in the case of HBT and a gate electrode in the case of MESFET) can be suppressed and high reliability of the device can be ensured particularly in a high temperature operation.

What is claimed is:

1. A method for fabricating a semiconductor device, comprising the steps of:

forming an overhanging structure having an umbrella-shaped portion on a semiconductor layer;

forming a protective film to cover an entire surface of said overhanging structure;

processing said protective film by removal so that an edge thereof on said semiconductor layer is positioned inside an edge of said umbrella-shaped portion;

depositing an electrode material on said semiconductor layer so that said electrode material and said semiconductor layer are connected to each other directly, using said umbrella-shaped portion as a mask;

and processing said electrode material to form an electrode at an interval from an edge of said protective film, wherein the protective film is apart from an edge of the electrode over the semiconductor layer.

2. The method for fabricating a semiconductor device according to claim 1, wherein, in said step of processing said protective film, said protective film is left in a state of existing inside said edge of said umbrella-shaped portion on said semiconductor layer.

3. The method for fabricating a semiconductor device according to claim 2, wherein, in said step of processing said protective film, a mask covering an area under said umbrella-shaped portion with an edge thereof being positioned inside said edge of said umbrella-shaped portion is formed, and using said mask, said protective film is selectively removed.

4. The method for fabricating a semiconductor device according to claim 3, in forming said mask, further comprising the steps of:

applying a resist onto an entire surface including an area under said umbrella-shaped portion;

exposing an entire surface of said resist to light; and developing said resist so that an unexposed part thereof selectively remains in an area under said umbrella-shaped portion.

5. The method for fabricating a semiconductor device according to claim 2, wherein, in said step of processing said protective film, said protective film is etched by an etching method having directivity with respect to a surface, instead of using a mask, and an edge of said protective film is made to be positioned inside an edge of said umbrella-shaped portion by controlling the amount of etching.

6. The method for fabricating a semiconductor device according to claim 1, wherein, in said step of processing said protective film, said protective film is left in a state in which said protective film is substantially removed from an surface of said semiconductor layer.

7. The method for fabricating a semiconductor device according to claim 6, in said step of processing said protective film, further comprising the steps of:

forming a resist covering an entire surface including an area under said umbrella-shaped portion, constituted in a manner in which a first layer having high optical sensitivity and a film thickness covering a part of an area under said umbrella-shaped portion and a second layer having low optical sensitivity are laminated;

exposing an entire surface of said resist to light; and forming a mask for processing said protective film by, in an area under said umbrella-shaped portion, developing said resist according to the respective optical sensitivities of said first layer and said second layer to be left into a shape covering only a surface of said structure in an area under said umbrella-shaped portion.

8. The method for fabricating a semiconductor device according to claim 1, wherein said structure is an emitter structure of a bipolar transistor, and said electrode is a base electrode of a bipolar transistor.

9. The method for fabricating a semiconductor device according to claim 1, wherein said structure is a gate electrode of a field effect transistor, and said electrode is a source electrode and a drain electrode of a field effect transistor.

10. A semiconductor device comprising:

a semiconductor layer;

an overhanging structure formed on said semiconductor layer and having an umbrella-shaped portion;

a protective film covering an entire surface of said overhanging structure with an edge thereof on said semiconductor layer being positioned inside an edge of said umbrella-shaped portion; and an electrode formed directly on said semiconductor layer, at a position outside said umbrella-shaped portion at an interval from an edge of said protective film on said semiconductor layer.

11. The semiconductor device according to claim 10, wherein said protective film is formed into a state of existing inside an edge of said umbrella-shaped portion on said semiconductor layer.

12. The semiconductor device according to claim 10, wherein said protective film is formed so that an edge thereof is positioned at a contact point of a root of said structure and said semiconductor layer.

13. The semiconductor device according to claim 10, wherein said structure is an emitter structure of a bipolar transistor, and said electrode is a base electrode of a bipolar transistor.

14. The semiconductor device according to claim 10, wherein said structure is a gate electrode of a field effect transistor, and said electrode is a source electrode and a drain electrode of a field effect transistor.

* * * * *